United States Patent
Grote et al.

(10) Patent No.: US 12,349,433 B2
(45) Date of Patent: Jul. 1, 2025

(54) TRANSISTORS WITH SELF-ALIGNED SOURCE-CONNECTED FIELD PLATES

(71) Applicant: NXP USA, Inc., Austin, TX (US)

(72) Inventors: Bernhard Grote, Phoenix, AZ (US); Philippe Renaud, Chandler, AZ (US); Humayun Kabir, Gilbert, AZ (US); Bruce McRae Green, Gilbert, AZ (US); Ibrahim Khalil, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 430 days.

(21) Appl. No.: 17/645,290

(22) Filed: Dec. 20, 2021

(65) Prior Publication Data
US 2023/0197795 A1    Jun. 22, 2023

(51) Int. Cl.
*H10D 64/01*    (2025.01)
*H01L 21/76*    (2006.01)
(Continued)

(52) U.S. Cl.
CPC ......... *H10D 64/01* (2025.01); *H01L 21/7605* (2013.01); *H01L 21/765* (2013.01);
(Continued)

(58) Field of Classification Search
CPC . H01L 29/401; H01L 21/7605; H01L 21/765; H01L 29/2003; H01L 29/402; H01L 29/66462; H01L 29/7786; H01L 29/42316; H01L 29/778; H10D 64/01; H10D 30/015; H10D 30/475; H10D 62/8503; H10D 64/111; H10D 64/411; H10D 30/47
See application file for complete search history.

(56) References Cited

U.S. PATENT DOCUMENTS 6,867,078 B1    3/2005 Green et al.
7,291,872 B2 *  11/2007 Hikita ................ H10D 64/256
                                         257/E29.253
(Continued)

FOREIGN PATENT DOCUMENTS

CN    11232661 A    2/2021
CN    113628964 A1  11/2021
WO    WO-2017069464 A1  4/2017

OTHER PUBLICATIONS

U.S. Appl. No. 17/561,793, filed Dec. 24, 2021, 51 pages.
(Continued)

*Primary Examiner* — Yara B Green
*Assistant Examiner* — Akhee Sarker-Nag

(57) ABSTRACT

Placement of a field plate in a field-effect transistor is optimized by using multiple dielectric layers such that a first end of field plate is separated from a channel region of the transistor by a first set of one or more distinct dielectric material layers. A second end of the field plate overlies the channel region and a control electrode from which it is separated by the first set of dielectric layers and one or more additional dielectric layers. Relative positioning of the control electrode and the field plate are determined by a single processing step such that the field plate is self-aligned to the control electrode in order to reduce variations in transistor performance associated with manufacturing process variations.

10 Claims, 8 Drawing Sheets

(51) Int. Cl.
  *H01L 21/765* (2006.01)
  *H10D 30/01* (2025.01)
  *H10D 30/47* (2025.01)
  *H10D 62/85* (2025.01)
  *H10D 64/00* (2025.01)
  *H10D 64/27* (2025.01)
(52) U.S. Cl.
  CPC ......... *H10D 30/015* (2025.01); *H10D 30/475* (2025.01); *H10D 62/8503* (2025.01); *H10D 64/111* (2025.01)

(56) References Cited

U.S. PATENT DOCUMENTS

| | | | |
|---|---|---|---|
| 7,592,211 | B2 | 9/2009 | Sheppard et al. |
| 7,696,535 | B2 | 4/2010 | Yang et al. |
| 7,812,369 | B2 | 10/2010 | Chini et al. |
| 8,049,252 | B2 | 11/2011 | Smith et al. |
| 8,120,064 | B2 | 2/2012 | Parikh et al. |
| 8,946,779 | B2 | 2/2015 | Green et al. |
| 9,419,122 | B1 | 8/2016 | Corrion et al. |
| 9,741,840 | B1 | 8/2017 | Moens et al. |
| 9,847,411 | B2 | 12/2017 | Sriram et al. |
| 9,911,817 | B2* | 3/2018 | Xia .............. H10D 30/675 |
| 12,148,820 | B2 | 11/2024 | Zhu et al. |
| 2006/0060895 | A1 | 3/2006 | Hikita et al. |
| 2008/0128752 | A1* | 6/2008 | Wu ............... H01L 29/778 257/E29.127 |
| 2012/0146107 | A1 | 6/2012 | Lim et al. |
| 2013/0193485 | A1* | 8/2013 | Akiyama ......... H10D 30/475 257/194 |
| 2013/0341679 | A1 | 12/2013 | Green et al. |
| 2014/0061659 | A1 | 3/2014 | Teplik et al. |
| 2014/0361343 | A1 | 12/2014 | Sriram |
| 2015/0279722 | A1 | 10/2015 | Kikuchi |
| 2017/0154988 | A1 | 6/2017 | Hurkx et al. |
| 2018/0033669 | A1* | 2/2018 | Salih ................ H10D 30/475 |
| 2019/0028006 | A1 | 1/2019 | Hamamura et al. |
| 2019/0097001 | A1 | 3/2019 | LaRoche et al. |
| 2019/0140086 | A1* | 5/2019 | Chikamatsu ........ H10D 30/475 |
| 2021/0336043 | A1 | 10/2021 | Birner et al. |
| 2021/0376148 | A1* | 12/2021 | Lee ................ H01L 29/42368 |

OTHER PUBLICATIONS

U.S. Appl. No. 17/561,796, filed Dec. 24, 2021, 51 pages.

Denninghoff, Daniel J. et al; "Design of High-Aspect-Ratio T-Gates on N-Polar GaN/AlGaN MIS-HEMTs for High f max"; IEEE Electron Device Letters, vol. 33, No. 6; 3 pages (Jun. 2012.

Elkashlan, R. Y. et al; "Analysis of Gate-Metal Resistance in CMOS-Compatible RF GaN HEMTs"; IEEE Trans. on Electron Devices, vol. 67, No. 11; 5 page (Nov. 2020).

Green, B. M. et al; "A High Power Density 26 V GaAs pHEMT Technology"; IEEE MTT-S Int'l Microwave Symposium Digest, Fort Worth, TX, US; 4 pages (2004).

Lee, Kiwon et al; "Improved DC and RF Performance of High Power AlGaN/GaN HEMTs with a Novel Inner Field-plate"; Proceedings of Asia-Pacific Microwave Conference; 4 pages (2006).

Piel, Pierre-Marie et al; "A 26 Volts, 45 Watts GaAs pHEMT for 2 GHz WCDMA Applications"; IEEE MTT-S Int'l Microwave Symposium Digest; Fort Worth, Texas, US; 4 pages (2004).

Xie, Gang et al; "Breakdown Voltage Enhancement for Power AlGaN/GaN HEMTs with Air-bridge Field Plate"; 24th Int'l Symposium on Power Semiconductor Devices and ICs, Bruges, BE; 2 pages (Jun. 2012).

Non Final Office Action; U.S. Appl. No. 17/645,276; 22 pages (Sep. 3, 2024).

Notice of Allowance; U.S. Appl. No. 17/645,286; 10 pages (Aug. 26, 2024).

Non Final Office Action; U.S. Appl. No. 17/645,280; 14 pages (Jan. 16, 2025).

* cited by examiner

TRANSISTORS WITH SELF-ALIGNED SOURCE-CONNECTED FIELD PLATES

FIELD OF THE INVENTION

Embodiments of the subject matter described herein relate generally to semiconductor devices with conductive elements and methods for fabricating such devices.

BACKGROUND OF THE INVENTION

Semiconductor devices find application in a wide variety of electronic components and systems. High power, high frequency transistors find application in radio frequency (RF) systems and power electronics systems. Gallium nitride (GaN) device technology is particularly suited for these RF power and power electronics applications due to its superior electronic and thermal characteristics. In particular, the high electron velocity and high breakdown field strength of GaN make devices fabricated from this material ideal for RF power amplifiers and high-power switching applications. Field plates are used to reduce gate-drain feedback capacitance and to increase device breakdown voltage in high frequency transistors. Accordingly, there is a need for semiconductor devices, and GaN devices in particular, with field plates.

SUMMARY OF THE INVENTION

In an example embodiment, a method of fabricating a semiconductor device is provided. The method includes depositing first electrically conductive material over a first dielectric layer. The first dielectric layer overlies a channel region of a semiconductive substrate suitable for use as a semiconductive transistor channel. The method also includes, simultaneously forming, during a first patterning step, first, second, and third conductive elements above the channel region. The first, second, and third conductive elements are electrically isolated from each other and the second conductive element is disposed between the first conductive element and the third conductive element. The first, second, and third conductive elements are formed by selectively removing a portion of the first electrically conductive material.

The method also includes depositing second dielectric material over the first, second, and, third conductive elements, and over the first dielectric layer; and, during a second patterning step, forming a first aperture between the first and second conductive elements that passes through the first dielectric layer and the second dielectric material. The first aperture is formed by selectively removing a first portion of the second dielectric material to leave remaining second dielectric material; and removing a portion of the first dielectric layer above the channel region in an area between the first and second conductive elements.

The method also includes forming an electrically conductive control electrode; forming a second aperture that passes through the second dielectric material; and forming an electrically conductive field plate interconnect. The control electrode electrically contacts the first and second conductive elements and extends within the first aperture. The second aperture is formed during a third patterning step. The field plate interconnect extends within the second aperture and electrically contacts the third conductive element within the second aperture.

In another example embodiment, a semiconductor device is provided. The device includes a channel region defined in a semiconductor substrate, a first current terminal electrically coupled to a first end of the channel region, and a second current terminal electrically coupled to a second end of the channel region. The device has a first dielectric layer having a first dielectric thickness that overlies the channel region and a first aperture in the first dielectric layer that overlies the channel region. The device also includes an electrically conductive control electrode, an electrically conductive field plate electrode, and at least an electrically conductive first electrode extension. The device is configured to provide an electrically conductive path from the first current terminal to the second current terminal via the channel region when a sufficient control voltage is applied to the control electrode.

The control electrode extends within the first aperture and is configured to be electrically coupled to the channel region. The first electrode extension is adjacent to the first aperture, contacts a first side of the control electrode, and at least partially overlies the first dielectric layer. The first electrode extension and the field electrode are each formed from the same electrically conductive material.

In one or more embodiments, the device also includes an electrically conductive second electrode extension opposite the first electrode extension that is also adjacent to the first aperture, at least partially overlies the first dielectric layer, and contacts a second side of the control electrode opposite the first side of the control electrode. In such embodiments the second electrode extension is formed from the same electrically conductive material as the first electrode extension and the field plate electrode.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein.

DETAILED DESCRIPTION

Figure 1:
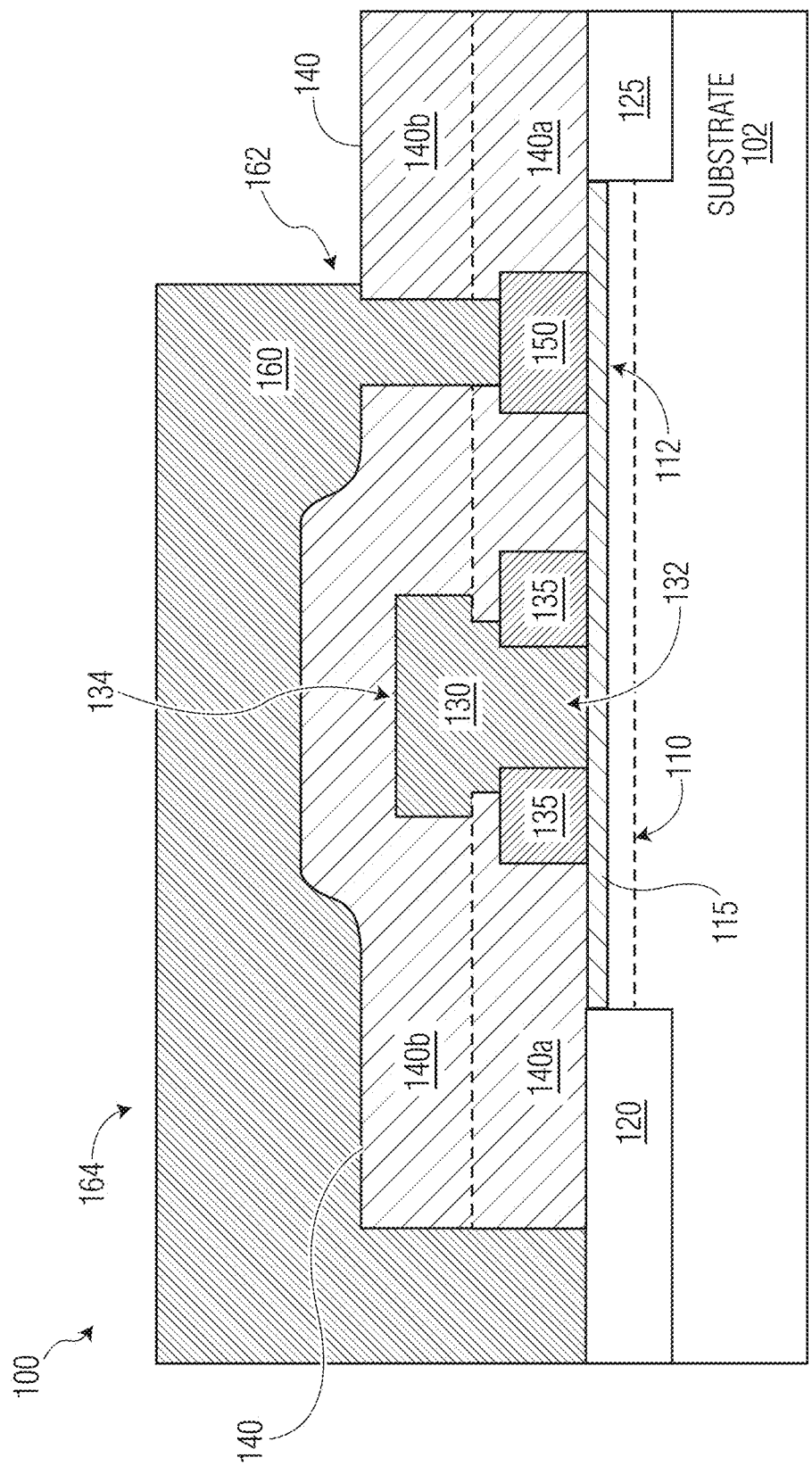
FIG. 1 is a cross-sectional schematic illustration of an example transistor according to embodiments herein.

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation and are made with reference to the orientation of the corresponding figure or figures for purposes of illustration.

It will be appreciated that the steps of various processes described herein are non-limiting examples of suitable processes according to embodiments and are for the purposes of illustration. Devices according to embodiments herein may be fabricated using any suitable processes including those that omit steps described above, perform those steps and similar steps in different orders, and the like. It will also be appreciated that well-known features of transistors may be omitted for clarity. For example, the Figures may not show additional dielectric layers and vias which may be present in one or more embodiments FIG. 1 is a cross-sectional schematic view of example transistor 100 provided with an electrode suitable for use as a field plate according to embodiments herein (a field plate 150). The transistor 100 is formed on a semiconductor substrate 102 and has a channel region 110 near a top surface 112. The transistor includes a first current terminal 120 electrically coupled to a first end of the channel region 110 and a second current terminal 125 electrically coupled to a second end of the channel 110 opposite the first current terminal 120. A first dielectric material 115 is disposed on the top surface 112 overlying the channel region 110. The first current terminal 120 and the second current terminal 125 may be formed by any suitable method. For example, they may be appropriately doped regions within the semiconductor substrate 102, or as metallic contacts deposited within recesses in the substrate 102 or on the surface of the substrate 102.

An electrically conductive first electrode (hereinafter a control electrode 130) contacts the channel region 110 through an aperture in the first dielectric material 115. As shown, the control electrode 130 may have a first section 132 that contacts the channel region 110 within the aperture and optionally has a second section 134 that overhangs the first dielectric material 115. Although the control electrode 130 is depicted as having vertical sidewalls, it will be understood that the control electrode 130 may have any suitable geometry. For instance, the first section 132 of the control electrode may have sidewalls that are curved or slanted (see FIG. 4A, FIG. 4B and FIG. 5 as non-limiting examples). Similarly, the second section 134 of the control electrode 130 may have sidewalls that are curved or slanted and the top surface (farthest from the channel region 110) may have any suitable geometry. The control electrode 130 is disposed in between the first current terminal 120 and the second current terminal 125 along the length of the channel region 110. The control electrode 130 is flanked by conductive elements 135 which serve as extensions of the control electrode 130. These extensions may also be referred to as gate field plates.

It will be appreciated that the first current terminal 120 may be operated, for example, as a source terminal of the transistor 100 and the second current terminal 125 may be operated, for example, as a drain terminal of the transistor 100. It also be understood that the control electrode 130 is suitable for use as a control electrode of the transistor 100 such that, when a suitable bias voltage is applied to the control electrode 130, the channel region 110 is configured to provide an electrically conductive path between the first current terminal 120 and the second current terminal 125 (i.e., between the source and drain of the transistor 100). It will be appreciated that the current terminals 120, 125 may have any acceptable geometry and that, in one or embodiments, the current terminals 120, 125 are provided with conductive electrodes that contact the current terminals 120, 125 which are not explicitly shown.

Additional dielectric material 140 overlies the control electrode 130 and various portions of the channel region 110. As shown in FIG. 1, this additional dielectric material 140 may include a second dielectric material 140a material and a third dielectric material 140b as shown in FIG. 1. It will be understood that, in one or more embodiments, the dielectric material 140a is the same as the dielectric material 140b or substantially similar to the dielectric material 140a. For instance, the dielectric materials 140a, 140b may be deposited at different times using the same process and the same or similar source materials. As a further example, the dielectric materials may both be an RF-sputtered oxide or nitride material. It will also be understood that in one or more embodiments, the dielectric materials 140a, 140b are different materials (e.g., the dielectric material 140a may be silicon nitride while the dielectric material 140b may be silicon oxide or aluminum oxide).

As shown in FIG. 1, the transistor 100 also includes a second electrode formed by conductive element (hereinafter a field plate 150) disposed above the channel region 110 in between the control electrode 130 and the second current terminal 125. An electrically conductive interconnect 160 overlies the control electrode 130 and has a first end 162 that is electrically coupled to the field plate 150 and a second end 164 that is electrically couples the first end 162 (and the field plate 150) to the first current terminal 120. In one or more embodiments, the interconnect 160 may be continuous along the width of a gate finger perpendicular to the cross section plane of FIG. 1. In one or more embodiments, the connection may only occur in portions of the gate finger width.

It will be understood that, when the first current terminal 120 is operated as a source terminal of the transistor 100, the field plate 150 is configured to operate as source-coupled field plate. In the transistor 100, the conductance of the channel region 110 during operation of the transistor 100 will be influenced by the electrical potential of the control electrode 130 and the field plate 150. It will be appreciated that the field plate 150 is capacitively coupled to the channel region 110 across the first dielectric material 115. Meanwhile the interconnect 160 is separated from the control electrode 130 by the dielectric material 140 and from the channel region 110 by both the dielectric material 140 and the dielectric material 115.

Generally, a source-coupled field plate such as the field plate 150 may be used to reduce gate-to-drain feedback capacitance ("$C_{GD}$") in transistors such as the transistor 100 when compared to otherwise similar transistors lacking such a field plate. However, the addition of a source-coupled field plate spaced apart from a control electrode such as the control electrode 130 will also tend to introduce additional capacitance between the gate and the source ("$C_{GS}$") which may be an undesirable trade-off. Often, a single dielectric may be deposited over a substrate that has already been provided with a channel region and a gate. In this instance, both the $C_{GD}$ reduction provided by a source field plate and the increased $C_{GS}$ associated with the field plate will depend strongly on the thickness and dielectric properties of that single dielectric layer.

Meanwhile, in the transistor 100, the placement of the field plate 150 as shown and described may confer certain advantages. Specifically, the relative dielectric constants and thicknesses of the dielectric material 115 and the dielectric material 140 may be chosen to achieve particular performance characteristics and to facilitate various fabrication procedures in embodiments herein. As an example, if the field plate 150 were formed above the dielectric material 140 (as in other transistors), both the $C_{GD}$ reduction achieved and the additional $C_{GS}$ introduced would depend upon the thickness and dielectric properties of the dielectric material 140. But in the example of FIG. 1, the field plate 150 is separated from the channel region 110 only by the dielectric material 115. This dielectric material 115 may be comparatively thin (i.e., thinner than all or part of the dielectric material 140) and/or have a relatively high dielectric constant (i.e., a dielectric constant that is higher than the dielectric constant of all or part of the dielectric material 140). Meanwhile, the additional $C_{GS}$ introduced will depend on the thickness and dielectric properties of the dielectric material 140 (i.e., the dielectric materials 140a, 140b). It will be appreciated that, in one or more embodiments, the dielectric material 140 may be configured to be thicker than the dielectric material 115 and/or to have a lower dielectric constant, thereby maximizing the $C_{GD}$ reduction achieved relative to the additional $C_{GS}$ introduced by the field plate 150 and interconnect 160.

As an example, in one or more embodiments, the dielectric material 115 is silicon nitride (SiN or $SiN_x$ where x is a fractional value other than one) and has a thickness in a range from 10 nm to 300 nm. As a further example, in one or more embodiments, the dielectric material 140 is silicon oxide ($SiO_2$ or $SiO_x$, where x is a fractional value other than two) and has a thickness in a range from 50 nm to 5000 nm. In one or more other embodiments (as described further below in connection with FIG. 4, dielectric material 115 may be deposited, to provide a first thickness underneath conductive elements 135, and a second thickness underneath at least a portion of the field plate 150 to facilitate independent optimization of their functions. For example, a thicker dielectric underneath the drain side of field plate 150 can be employed to yield a better trade-off between reducing $C_{GD}$ and increasing $C_{DS}$. Such an arrangement may have the advantage of reducing the peak electric field strength in the channel region during operation of a transistor such as the transistor 100, resulting in improved breakdown voltage characteristics.

It will be understood that features of the transistor 100 above (and features of other example transistors herein) may be compatible with various transistor technologies. For instance, the transistor 100 and/or any other example transistor according to embodiments herein may be a MOSFET or MISFET fabricated on a silicon substrate or any other suitable semiconductor substrate. For instance, In one or more embodiments, the transistor 100 is a III-V compound semiconductor-based high-electron-mobility transistor ("HEMT"), otherwise known as a heterostructure field effect transistor ("HFET"). In such embodiments the effective semiconductor channel may be a 2D electron gas ("2DEG") formed at a semiconductor heterojunction disposed within the channel region 110 according to known techniques. In one or more embodiments, the transistor 100 may be a gallium-nitride (GaN) based HEMT. In some such embodiments, a 2DEG is formed at an interface between a GaN layer and an aluminum doped layer with a stochiometric composition described by the chemical formula $Al_xGa_{1-x}N$. It will be understood that in some such embodiments the effective channel through which current conduction occurs may be buried within the channel region 110 and may not extend to the top surface 112 of the channel region 110. In one or more embodiments, the first dielectric material 115 may be a material that provides surface passivation for the channel region 110. For instance, the first dielectric material 115 may be a silicon nitride passivation layer over a GaN-based heterostructure.

FIGS. 2A-2E illustrate steps in an example process 200 for fabricating a transistor with a source-coupled field plate according to embodiments herein. For purposes of illustration, the process 200 is described with respect to fabrication of the transistor 100 of FIG. 1. It should be understood that use of the process 200 may confer additional advantages beyond those described in connection with FIG. 1.

Specifically, the performance of a transistor such as the transistor 100 may be sensitive to the relative distance of the field plate 150 to the control electrode 130 and to the surface area of the field plate 150 above the channel region 110 relative to the surface area of the first section 132 of the control electrode 130 above the channel 110. In other approaches, patterning of the control electrode 130 and the field plate 150 may be performed independently (e.g., during two separate lithographic steps), which case the separation between the control electrode 130 and the field plate 150 will be subject to interlayer alignment tolerances of the fabrication process. In some instances, this may lead to undesirable variation in the performance of individual transistors fabricated on separate wafers and potentially between transistors fabricated on the same wafer (e.g., if there is a misalignment between the relevant lithographic steps. Process flows that can reduce part-to-part variation may therefore be desirable.

As described below, an example process 200 is configured to produce transistors such as the transistor 100 in which the control electrode 130 and the field plate 150 are self-aligned. Specifically, it will be understood that spacing between the control electrode 130 and the field plate 150 is determined by the spacing between the leftmost conductive element 135 and the field plate 150. In addition, the location and dimensions of the first section 132 of the control electrode 130 is determined by the location and spacing of the conductive elements 135. As described below, the process 200 includes forming these elements simultaneously.

FIGS. 2A-2E illustrate example steps in the example process 200 for fabricating transistors with second electrodes operable as source-coupled field plates according to embodiments herein. The example process includes steps 210, 220, 230, 240, and 250, which are depicted being performed to fabricate the transistor 100 of FIG. 1. As above, the Figures, including FIGS. 2A-2E are not necessarily to scale. It will be therefore be appreciated that certain elements of the process 200 are depicted in FIGS. 2A-2E may omit certain details of relative dimensions and geometries of various elements. As one example, it will be appreciated that in many known lift-off processes, it is desirable for the photoresist thickness to exceed the thickness of the material being lifted off. However, for ease of illustration, the thickness of various sacrificial layers (e.g., the sacrificial materials 212, 232, 242, 252) may be depicted as being of similar thickness to the materials being lifted off. Similarly, angled and/or under-cut side-wall profiles are frequently desirable in lift-off process but such features may not be explicitly depicted.

At the outset of the process 200, the substrate 102 is already provided the channel region 110, the dielectric material 115 above the top surface 112 of the channel region 110, and with the current terminals 120, 125 as described in connection with FIG. 1. In one or more embodiments, the dielectric thickness beneath the field plate 150 may be the dielectric material 115 may have a uniform thickness. In one or more other embodiments, suitable deposition and etch steps may be used to form the dielectric material 115 with different thicknesses in selected regions, while in one or more other embodiments, the dielectric material may be supplemented by another material (e.g., the dielectric material 417 described in connection with FIG. 4, below).

Figure 2A:
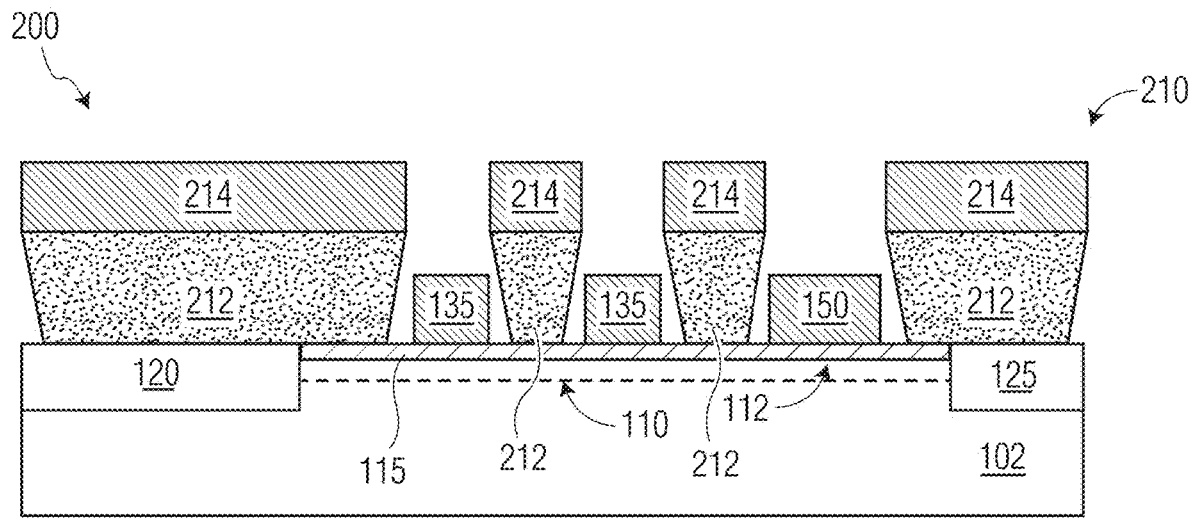
FIGS. 2A-2E are cross-sectional schematic illustrations of the transistor of FIG. 1 during various steps of an example process for fabricating transistors according to embodiments herein.
Figure 2B:
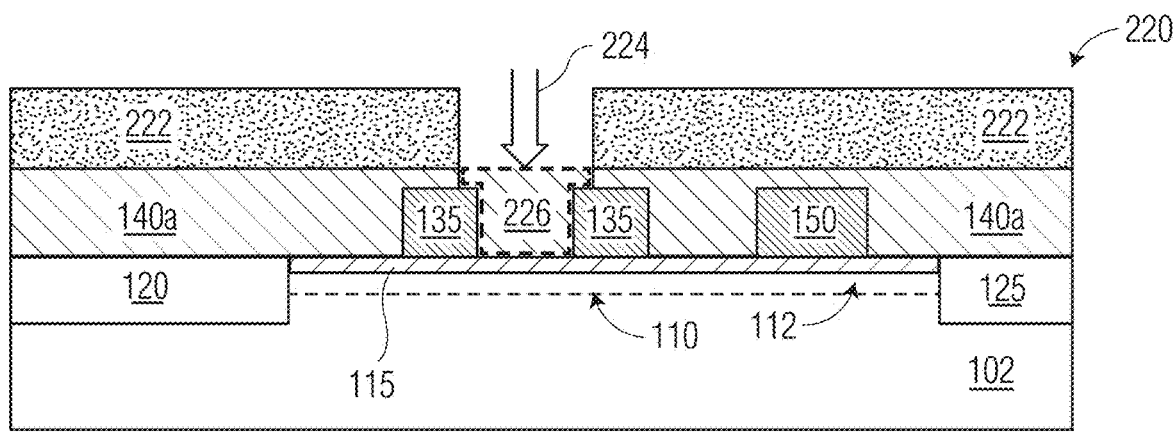

At step 210, depicted by FIG. 2A, electrically conductive material is deposited and patterned on the substrate 102 using any suitable process. For example, as shown in FIG. 2A, a sacrificial material 212 is patterned above the substrate 102 before the electrically conductive material is deposited. Undesired electrically conductive material 214 resting on the sacrificial material 212 is removed, leaving two conductive elements 135 and a third conductive element (the field plate 150) behind, as seen in FIG. 2B. As a non-limiting example, the sacrificial material may photolithographically patterned photoresist material. The photoresist is then stripped from the substrate 102 using a solvent, taking the undesired electrically conductive material 214 with it (a lift-off process). It will be appreciated that in other examples other suitable additive or subtractive processes may be used.

As another non-limiting example (not depicted), electrically conductive material may be deposited across the area shown, followed by lithographic patterning of an etch mask and etching of the electrically conductive material, except in the areas corresponding to the electrically conductive elements 135 and the field plate 150. In one or more embodiments, conductive contacts (not shown) to the current terminals 120, 125 may be simultaneously formed at step 210 from the same electrically conductive material along with the electrically conductive elements 135 and the field plate 150. Alternatively, a suitable conductive material may be deposited and selectively etched to form the electrically conductive elements 135 and field plate electrode 150.

At step 220, depicted by FIG. 2B, the dielectric material 140a is deposited above the dielectric layer 115, the electrically conductive elements 135, and the field plate 150, followed by deposition and patterning of sacrificial material 222 for use as an etch mask. As shown, the sacrificial material 222 is patterned to expose an area above and between the electrically conductive elements 135. The dielectric material 140a may then be etched using an etch process 224 to form an aperture in the region 226 indicated by dashed lines. The etch process 224 may be any suitable anisotropic process including, but not limited to dry plasma etching processes (e.g., sputter etching and/or reactive ion etching). The etch process 224 removes the exposed portions of the dielectric material 140a, leaving an aperture that exposes the dielectric layer 115 above the channel region 110. The electrically conductive material may be chosen at least in part for its resistance to the etch process 224 such that the etch process 224 etches the dielectric material 140a at a significantly faster rate than it removes the electrically conductive material forming the electrically conductive elements 135 and the field plate 150. In other words, the electrically conductive elements 135 and the field plate 150 serve as a hardmask during process 224 that defines the location and dimensions of the first section 132 of the control electrode 130.

Figure 2C:
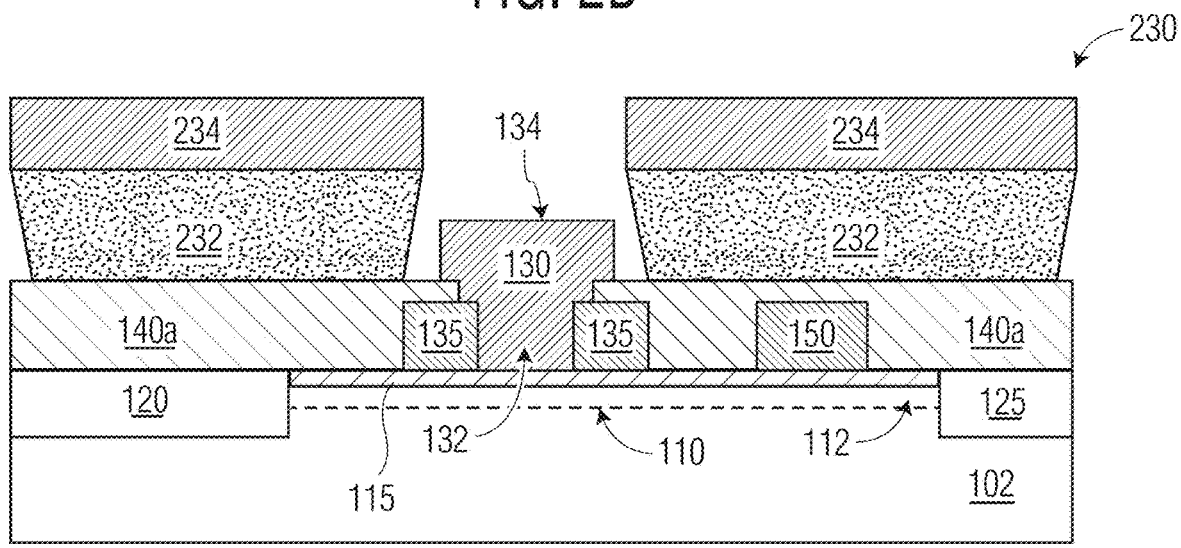

At step 230, depicted by FIG. 2C, the control electrode 130 is formed in the aperture in the dielectric material 140a formed at step 220. As shown, the control electrode 130 is formed by a lift-off process in which sacrificial material 232 such as photoresist is deposited and patterned, following by deposition of electrically conductive material (e.g., a metal or metal alloy such as gold, copper, silver, etc.). However, it will be understood that any suitable additive or subtractive process may be used to form the control electrode 130. It will be appreciated that the width and shape of the aperture in the dielectric material 140a will be determined by the spacing of the electrically conductive elements 135 and the etch process 224 as performed during step 220. For instance, the first end of the control electrode 130 will tend to have vertical sidewalls when a highly anisotropic etch is chosen for the etch process 224, whereas if the etch process 224 is less highly anisotropic, the first section 132 of the control electrode 130 may have sloping sidewalls (e.g., as visible in the control electrode 430 depicted in FIG. 4A and FIG. 4B). The shape of the second end 134 of the control electrode will be determined at least in part by the width of the opening formed in the sacrificial material 232 (if a lift-off process is used) and the second end 134 may have vertical or sloping sidewalls, depending on the process parameters chosen. As shown, the control electrode 130 has a staggered T-shaped profile. In one or more embodiments, as shown, a portion of the dielectric material 140a remains over the electrically conductive elements 135 and the field plate 150 and underneath the second section 134 of the control electrode 130. In one or more other embodiments, the dielectric material 140a may be removed. In other embodiments, portions of the dielectric material 140a may be removed using an anisotropic etch process confgured to leave portions of the dielectric material 140a beneath the second section 134 of the control electrode 130 in place.

Figure 2D:
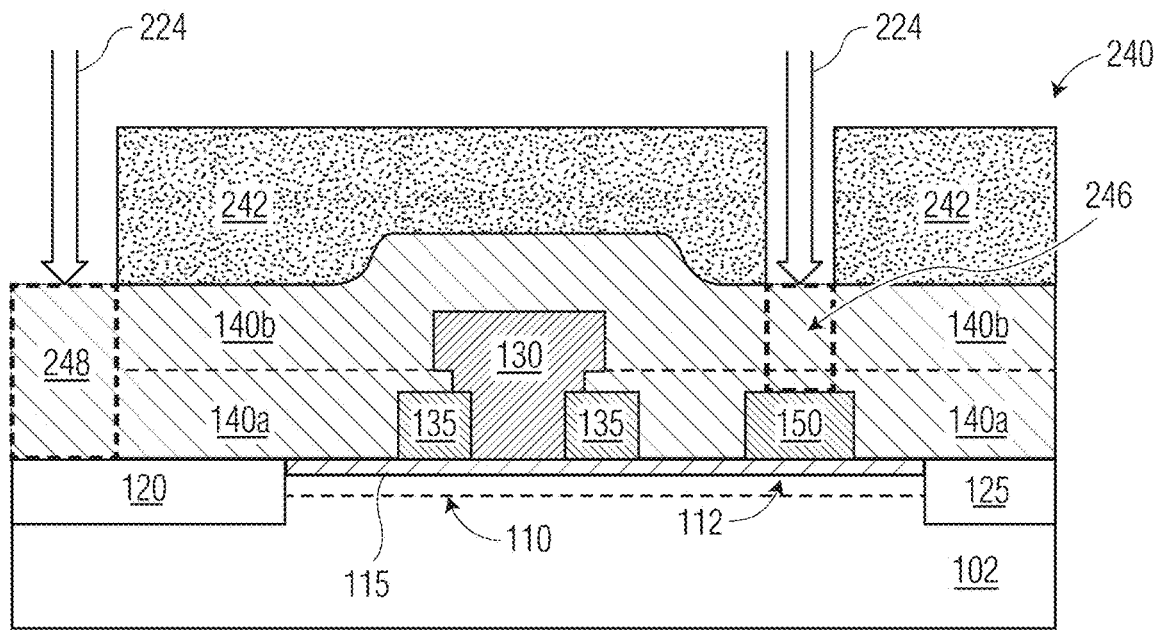

At step 240, depicted by FIG. 2D, additional dielectric material 140b is deposited above the control electrode 130. As above, in one or more embodiments, the dielectric material 140b is the same or similar to the dielectric material 140a. Meanwhile, in one or more embodiments, the dielectric material 140b is different from the dielectric material 140a. As shown, sacrificial material 242 (e.g., photoresist or any other suitable material) is patterned above the dielectric material 140b to serve as an etch mask for an etching process 244 which selectively removes the dielectric material 140 (i.e., the dielectric materials 140b, 140a) in the openings exposed in the regions 246,248. In one or more embodiments (e.g., those in which the dielectric materials 140a, 140b are different from each other), the etch process may be a two-part etch process, in which a first etch is performed to selectively remove the dielectric material 140b and a second etch is performed to remove the dielectric material 140a).

Figure 2E:
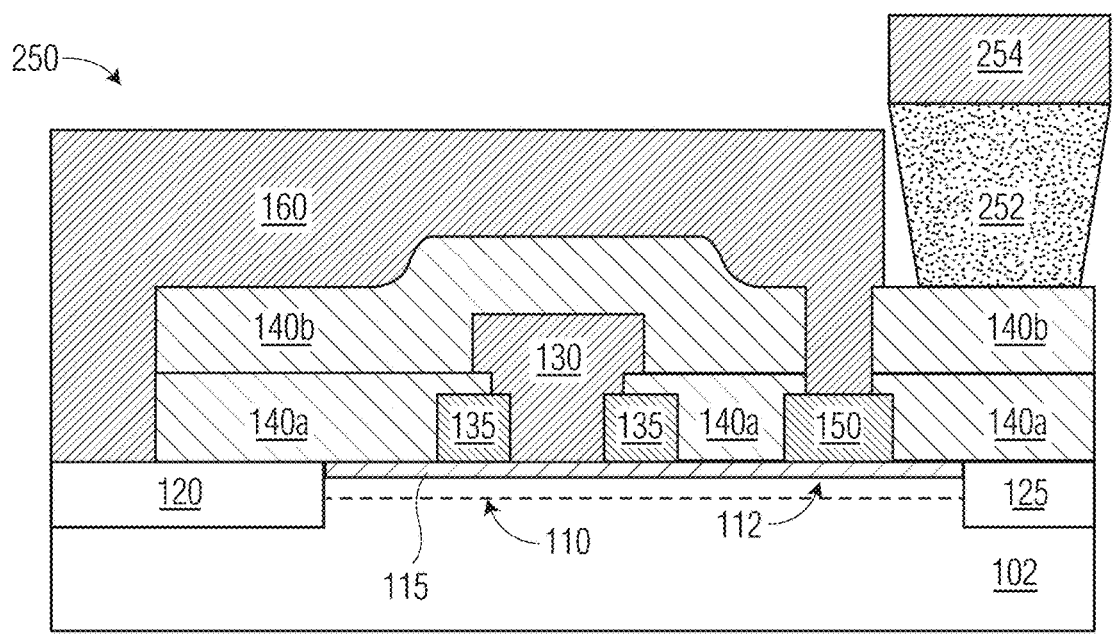

At step 250, depicted by FIG. 2E, sacrificial material 262 (e.g., photoresist) is patterned using any suitable process, followed by deposition of electrically conductive material. The conductive material may be deposited by any suitable process (e.g., thermal evaporation, sputtering, etc.). As shown, electrically conductive material fills the openings in the regions 246,248 formed at step 240 in order to form the interconnect 160 which electrically couples the field plate 150 to the current terminal 120 which may be operated as the source terminal of the transistor 100. As depicted in FIG. 2E, a lift-off process may be used to remove the sacrificial material 262 and the undesired electrically conductive material 264 with it, leaving only the interconnect 160 behind. It will be appreciated that while an additive process is depicted in FIG. 2E, any suitable process, including a subtractive patterning process may be used to pattern the interconnect 160.

Figure 3:
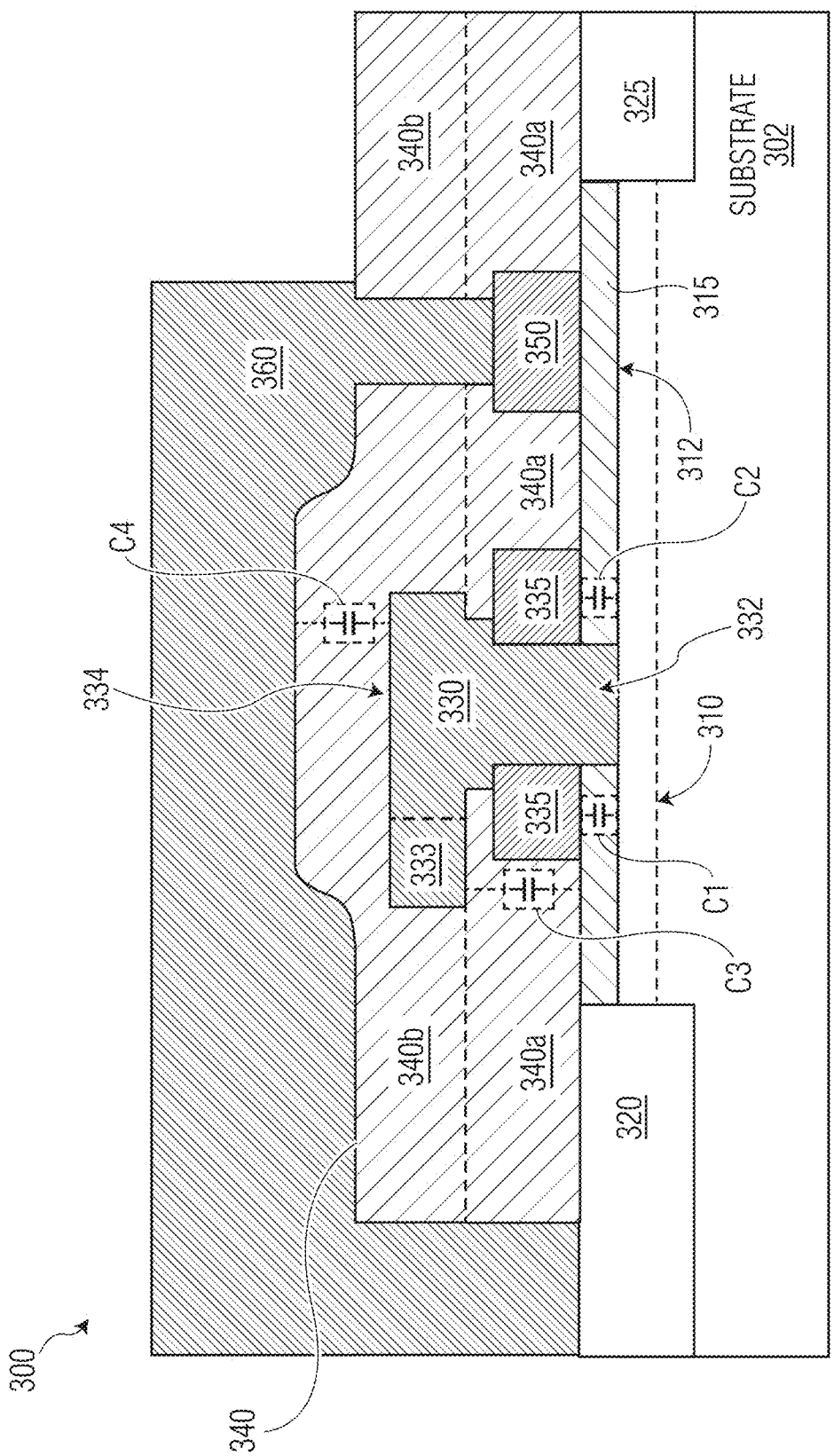
FIG. 3 is a cross-sectional schematic illustration of an example transistor similar to the transistor of FIG. 1 according to embodiments herein.

It will be understood that dimensions of various features shown and described herein may be varied for to realize particular performance characteristics and other benefits. As an example, FIG. 3 is a cross-sectional schematic view of transistor 300 according to embodiments herein that is a variation of the example transistor 100. Similarly to the transistor 100, the transistor 300 is formed on a semiconductor substrate 302 (e.g., the substrate 102). The transistor 300 has a channel region 310 (e.g., the channel region 110) coupled to a current terminal 320 and a current terminal 325 (e.g., the current terminals 120, 125) with a first electrode (a control electrode 330 such as the electrode 130) disposed between the two current terminals. The control electrode 330 has a first section 332 and a second section 334 (e.g., the first section 132 and the second section 134 of the electrode 130). The first section 332 electrically contacts the channel region 310 within an aperture in the dielectric material 315 (e.g., the dielectric material 115).

The transistor 300 also includes an electrode which is suitable for use a source-coupled field plate (a field plate 350, such as the field plate 150) and is electrically coupled to the current terminal 320 via an electrically conductive interconnect 360 (e.g., the interconnect 160). Notably the gate electrode 330 has an asymmetrical profile wherein the second section 334 of the control electrode 330 extends towards the current terminal 320 (operable as a source terminal connected to the source-coupled field plate 350). The asymmetrical profile of the control electrode 330 due to the laterally-extended portion 333 allows for additional electrically conductive material to form the control electrode 330, thereby reducing gate resistance. Meanwhile, the material and thickness of the dielectric material 342a can be chosen to mitigate additional $C_{GS}$. Low gate resistance may provide increased power gain for RF power devices. Alternatively, longer gate fingers are possible for the same gain improving layout aspect ratio and reducing die area.

It will be understood that various materials may be chosen to form the features described above in one or more embodiments and these choices may be made for ease of manufacturing, for economic reasons, and/or to achieve particular performance characteristics. As an example, in one or more embodiments, the electrically conductive elements and the field plate may be formed from a first metal or metal alloy while the control electrode and the interconnect may be formed from a second metal or metal alloy. In one or more examples titanium, tungsten, or alloys thereof may be used as the first metal due to their suitability for use as etch masks and their adhesion properties, whereas the second metal may be a more highly conductive metal or metal alloy such as gold, silver, copper or alloys thereof. Moreover, conductive layers may be formed by stacks of different metals as convenient for processing or for achieving desired performance characteristics.

Similarly, the various dielectric layers of the transistors 100, 300 and other transistors described herein may be chosen to obtain desired performance characteristics including, but not limited to, particular values of $C_{GD}$, $C_{GS}$, and transistor threshold voltages. For instance, in one or more embodiments, the first dielectric layer and the second dielectric material (e.g., the dielectric material 115, and the dielectric material 140, and/or the dielectric materials 140a, 140b) are configured such the channel region (e.g., the channel region 110) is fully depleted of free charge carriers beneath the field plate electrode (e.g., the field plate electrode 150) when an electrostatic potential difference between the field plate electrode and the channel region is between −2 Volts and −30 Volts.

In one or more embodiments having a laterally-extended control electrode such as the laterally-extended portion 333, the various dielectric materials (e.g., the dielectric materials 315, 340a) are configured such that the summed capacitance per area between the electrically conductive elements (e.g., the conductive elements 335) flanking the control electrode and the channel region (depicted by the respective capacitances C1 and C2 between the electrically conductive 335 and the channel region 310 in FIG. 3) is at least five times the capacitance per area between the laterally extended portion of the control electrode and the channel region depicted by C3 in FIG. 3. In other words, (C1+C2)>(5×C3). Furthermore, in one or more embodiments, the capacitance per area between the electrically conductive elements (i.e., C1+C2 in FIG. 3) and the channel region is at least ten times greater than the capacitance per area between the control electrode and field plate interconnect above it, depicted by the capacitance C4 between the second portion 334 of the gate electrode 330 and the field plate interconnect 360. In other words, (C1+C2)>(10×C4).

Figure 4:
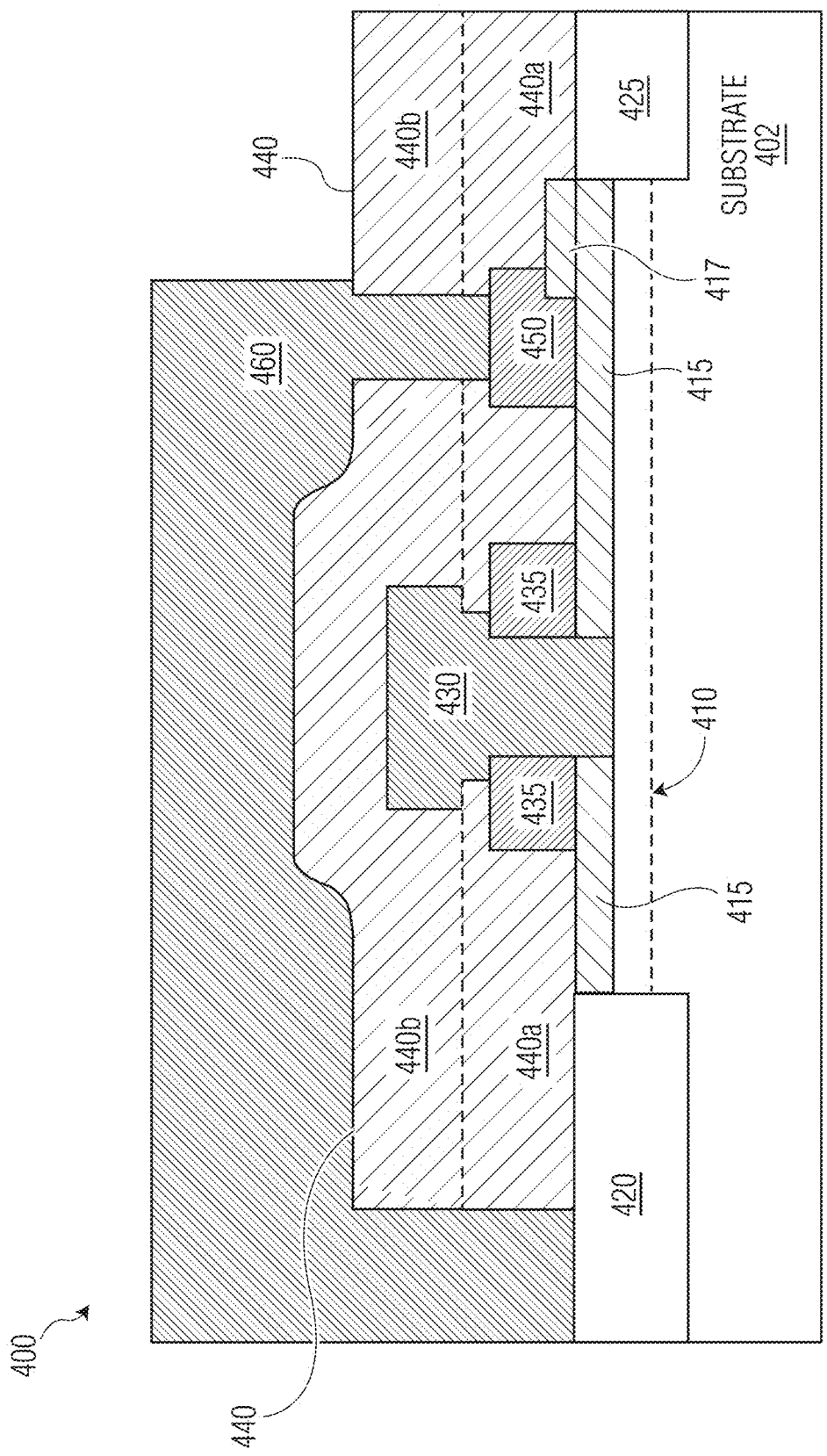
FIG. 4 is a cross-sectional schematic illustration of an example transistor similar to the transistor of FIG. 1 according to embodiments herein

In one or more embodiments, at least two different dielectric thicknesses separate a field plate (e.g., a field plate 150, 350) from the channel region (e.g., a channel region 110, 310). FIG. 4 is a schematic cross-sectional illustration one such embodiment. The transistor 400 has a channel region 410 that is electrically contacted on opposite ends by current terminals 420,425 on a substrate 402. A control electrode 430 (e.g., the control electrode 130) directly contacts the channel region 410. Unlike the field plate 150 of the transistor 100, the field plate 450 of the transistor 400 is separated from the channel region on the side nearest the control electrode 430 by the dielectric material 415 but is separated by both the dielectric material 415 and the additional dialectic material 417 on the side nearest the current terminal 425 which may be operated as the drain of the transistor 400. In one or more embodiments, the dielectric material 417 is the same as the dielectric material 415. For example, the dielectric material 415 may be deposited across the substrate 402 and then later patterned such that the dielectric material 417 is an area where dielectric material 415 has not been thinned. Alternatively, the dielectric material 417 may be formed by an additive process (e.g., a lift-off process) in which the dielectric material 417 is deposited above the previously-deposited dielectric material 415. In one or more embodiments the dielectric material 417 is different from the dielectric material 415.

Figure 5A:
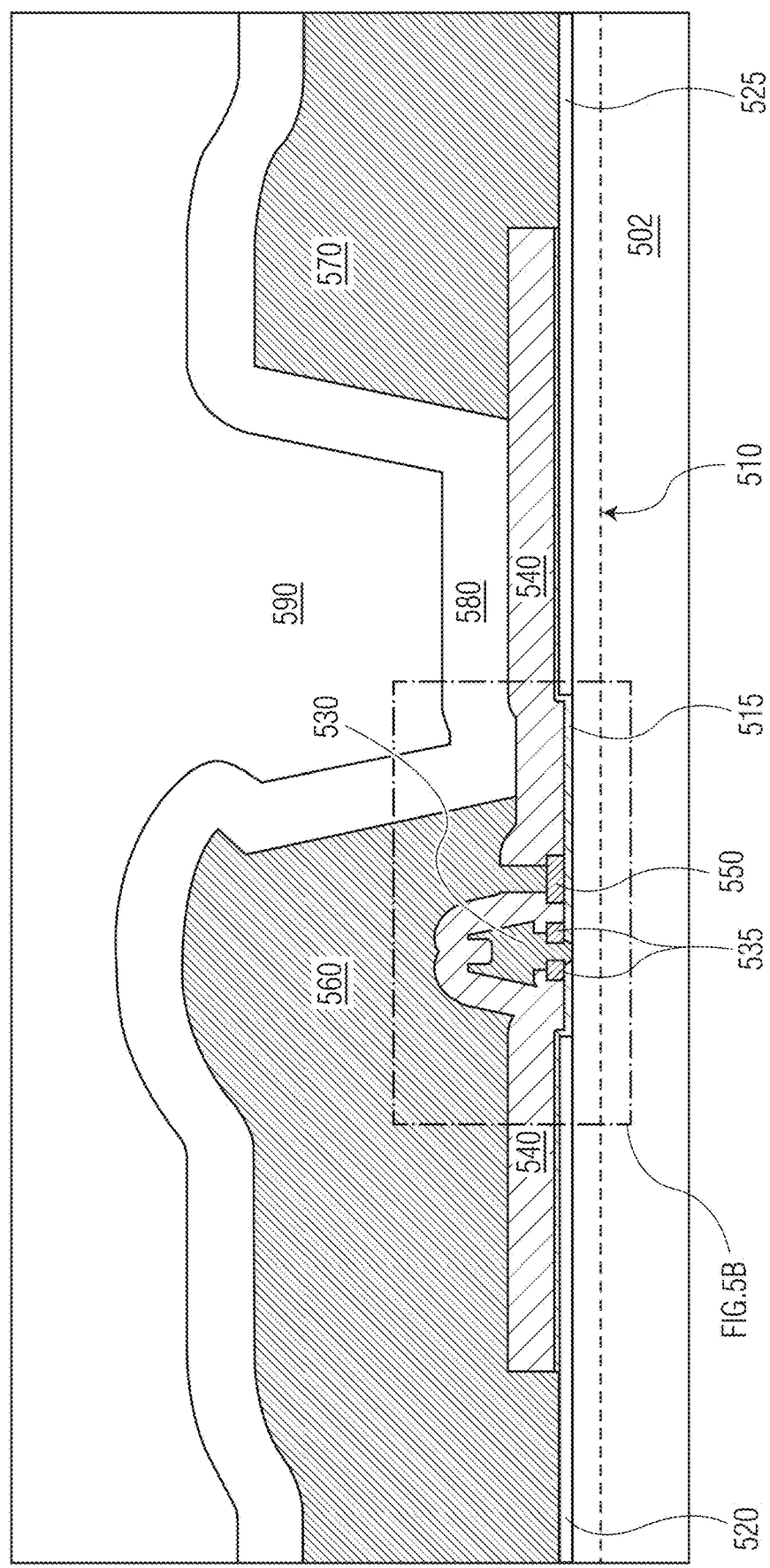
FIGS. 5A and 5B are cross-sectional schematic illustrations of an example transistor according to embodiments herein depicted with various features shown roughly to scale.
Figure 5B:
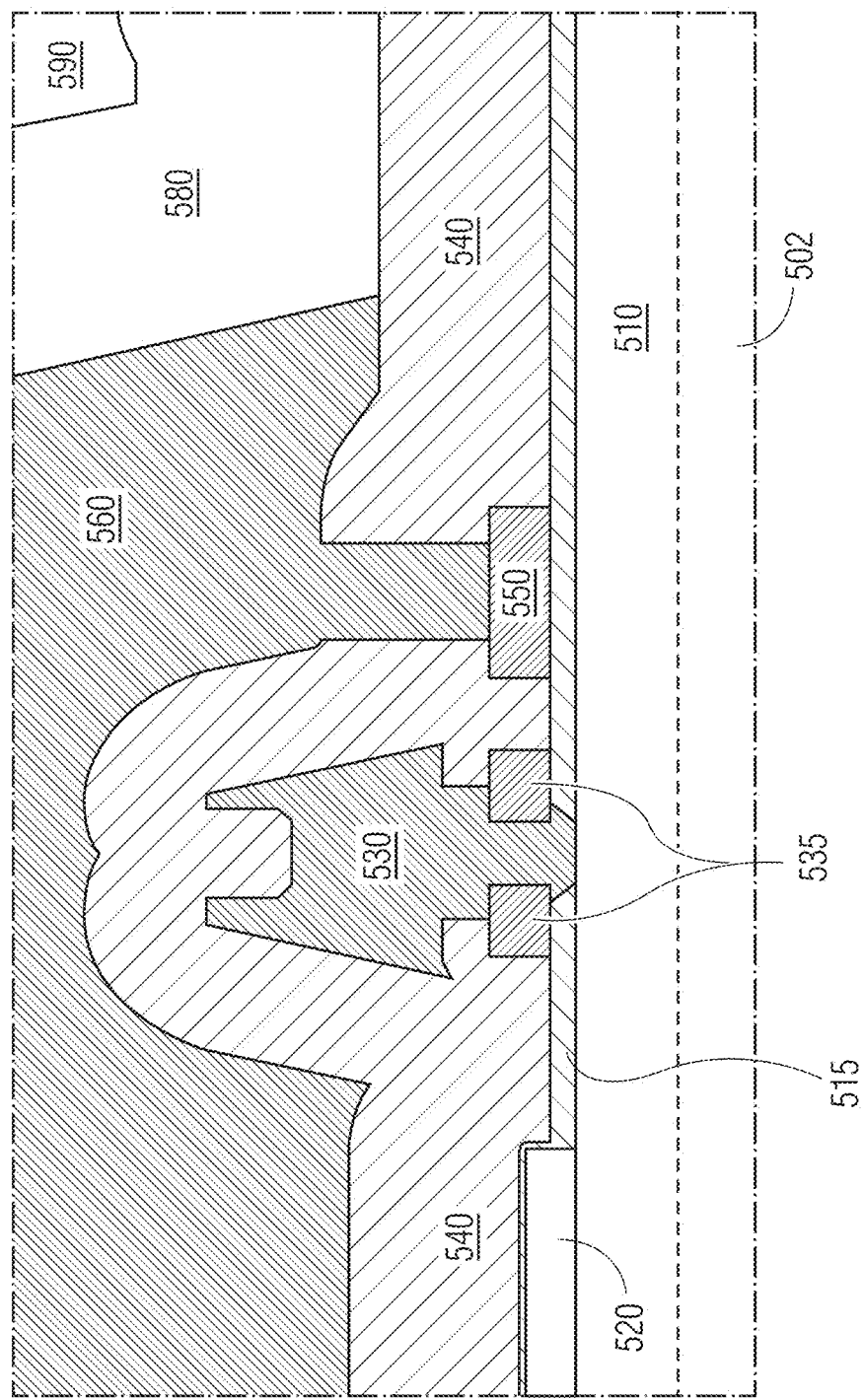

As above, the example transistors 100,300 are represented schematically. FIG. 5A and FIG. 5B are schematic illustrations of an example transistor 500 in which various features of one or more embodiments are represented in greater detail and represented approximately to scale. The transistor 500 is fabricated on a substrate 502 (e.g., a substrate 102/302/402) and has a channel region 510 (e.g., a channel region 110/310/410) with a first dielectric layer 515 disposed above the channel region 510 (e.g., a channel region 110/310/410). The transistor 500 has a first current terminal 520 (e.g., a current terminal 120/320/420) and a second current terminal 525 (e.g., a current terminal 125/325/425). The transistor 500 has a control electrode 530 with a noticeably more complex geometry than shown in FIGS. 1-4 that may result from the anisotropic deposition that results from a metal evaporation process. Also shown is the dielectric material 540 (e.g., dielectric material 140/340/440) above the control electrode 530, and the current terminals 520,525 and beneath a field plate interconnect 560 (e.g., a field plate interconnect 160/360/460). Also shown is an electrically conductive contact 570 electrically coupled to the current terminal 525 and additional dielectric layers 580,590.

Figure 6:
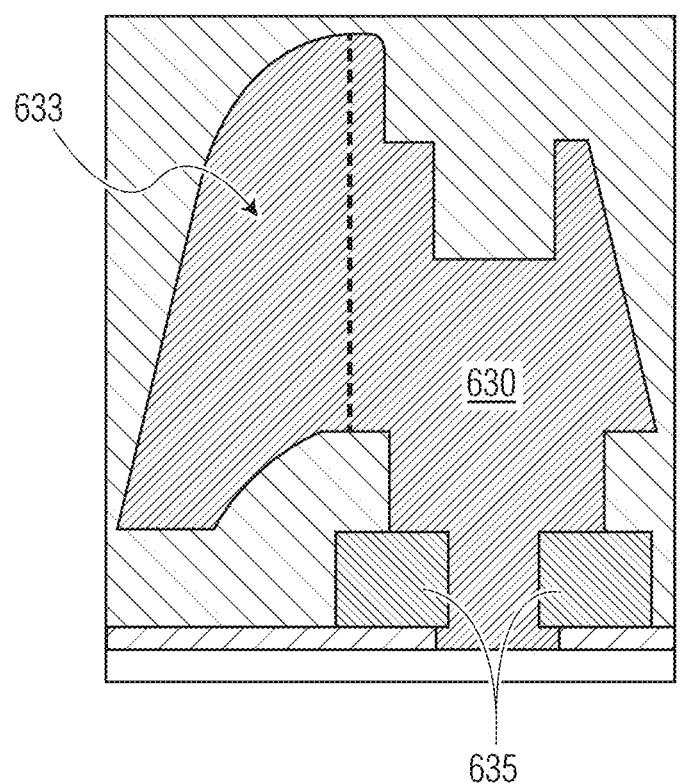
FIG. 6 is a cross-sectional schematic illustration showing an example transistor gate according to embodiments herein with various features roughly to scale.

FIG. 6 is a cross-sectional schematic illustration of an example control electrode 630 with an asymmetrical profile due to a laterally-extended portion 633 (e.g., the laterally-extended portion 333 of the control electrode 330). The control electrode 630 is shown flanked by two conducive elements 635 (e.g., conductive elements 135/335/435/535).

EXAMPLES

Features of embodiments may be understood by way of one or more of the following examples:

Example 1: A method of fabricating a semiconductor device that includes depositing first electrically conductive material over a first dielectric layer. The first dielectric layer overlies a channel region of a semiconductive substrate suitable for use as a semiconductor transistor channel. The method also includes, simultaneously forming, during a first patterning step, first, second, and third conductive elements above the channel region. The first, second, and third conductive elements are electrically isolated from each other and the second conductive element is disposed between the first conductive element and the third conductive element. The first, second, and third conductive elements are formed by selectively removing a portion of the first electrically conductive material.

The method of Example 1 also includes depositing second dielectric material over the first, second, and, third conductive elements, and over the first dielectric layer; and, during a second patterning step, forming a first aperture between the first and second conductive elements that passes through the first dielectric layer and the second dielectric material. The first aperture is formed by selectively removing a first portion of the second dielectric material to leave remaining second dielectric material; and removing a portion of the first dielectric layer above the channel region in an area between the first and second conductive elements.

The method of Example 1 also includes forming an electrically conductive control electrode; forming a second aperture that passes through the second dielectric material; and forming an electrically conductive field plate interconnect. The control electrode electrically contacts the first and second conductive elements and extends within the first aperture. The second aperture is formed during a third patterning step. The field plate interconnect extends within the second aperture and electrically contacts the third conductive element within the second aperture.

Example 2: A method as in Example 1 that further includes depositing additional dielectric material that overlies the control electrode and the remaining second dielectric material. In this example, forming the second aperture also includes selectively removing the additional dielectric material above the third conductive element to leave remaining additional dielectric material above the channel region and to leave the first and second conductive elements above the channel region.

Example 3: A method as in Example 2 that further includes causing a portion of the field plate interconnect to overlie the remaining additional dielectric material and the control electrode; and causing the field plate interconnect to electrically contact a first current terminal of the transistor at a first end of the channel region opposite the first, second, and third conductive elements that is nearest to the first conductive element.

Example 4: A method as in either of Examples 2 or 3, in which an effective dielectric constant of the additional dielectric material is lower than an effective dielectric constant of the first dielectric layer.

Example 5: A method as in any of Examples 1-4, in which forming the first aperture includes anisotropically etching the second dielectric material using a first anisotropic etching procedure. In this example, the first anisotropic etching process is characterized by a first etch rate with the respect to the to second dielectric material and a second etch rate with respect to the first electrically conductive material that is lower than the first etch rate.

Example 6: A method as in any of Examples 1-5, in which the first electrically conductive material is titanium, a titanium-tungsten alloy, or an aluminum-titanium alloy.

Example 7: A method as in any of Examples 2-6, in which forming the second aperture includes anisotropically etching the remaining second dielectric material and the remaining additional dielectric material using a second anisotropic etching procedure. In this example, the second anisotropic etching process is characterized by a third etch rate with respect to the additional dielectric material and a fourth etch rate with respect to the first electrically conductive material that is lower than the third etch rate.

Example 8: A method as in any of Examples 1-7, in which selectively removing a portion of the first electrically conductive material includes forming source and drain electrodes from the first electrically conductive material at opposite ends of the channel region simultaneously with forming the first, second, and third conductive elements.

Example 9A: A method as in any of Examples 1-8, in which the first dielectric layer has a thickness of less than 300 nanometers; and Example 9: A method as in any of Examples 2-8, in which the first dielectric layer has a thickness of less than 300 nanometers. In this example, a cumulative thickness of the second dielectric material and the additional dielectric material is in a range from 50 to 5000 nanometers.

Example 10: A method as in any of Examples 1-9 that further includes forming a dielectric spacer above the first dielectric layer at a location between a first end and a second end of the channel region; and causing a portion of the third conductive element to overlie the dielectric spacer.

Example 11: A semiconductor device that includes a channel region defined in a semiconductor substrate, a first current terminal electrically coupled to a first end of the channel region, and a second current terminal electrically coupled to a second end of the channel region. The device of Example 11 has a first dielectric layer having a first dielectric thickness that overlies the channel region and a first aperture in the first dielectric layer that overlies the channel region. The device also includes an electrically conductive control electrode, an electrically conductive field plate electrode, and at least an electrically conductive first electrode extension. The device of Example 11 is configured to provide an electrically conductive path from the first current terminal to the second current terminal via the channel region when a sufficient control voltage is applied to the control electrode.

The control electrode extends within the first aperture and is configured to be electrically coupled to the channel region. The first electrode extension is adjacent to the first aperture, contacts a first side of the control electrode, and at least partially overlies the first dielectric layer. The first electrode extension and the field electrode are each formed from the same electrically conductive material.

Example 12: A semiconductor device as in Example 11 that further includes a dielectric spacer disposed between the first dielectric layer and a portion of the field plate electrode.

Example 13: A semiconductor device as in either of Examples 11 or 12 in which the channel region is formed by a two-dimensional electron gas (2DEG).

Example 14: A semiconductor device as in any of Examples 11-13, in which the channel region is formed by a 2DEG within a III-V semiconductor heterostructure.

Example 15: A semiconductor device as in any of Examples 11-14 that further include sat least an electrically conductive second electrode extension adjacent to the first aperture. The second electrode extension at least partially overlies the first dielectric layer and contacts a second side of the control electrode that is opposite the first side of the control electrode. In this example, the second electrode extension is formed from the first electrically conductive material.

Example 16: A semiconductor device as in any of Examples 11-15, in which the control electrode is composed of first electrically conductive material and the first electrode extension is composed of second electrically conductive material that is different from the first electrically conductive material.

Example 17: A semiconductor device as in any of Examples 11-16 that further includes second dielectric material having a second dielectric thickness and overlying the first dielectric material; a second aperture through the second dielectric material above the field plate electrode; and an electrically conductive field plate interconnect that extends through the second aperture and is electrically coupled to the field plate electrode within the second aperture.

Example 18: A semiconductor device as in Example 17 in which additional dielectric material at least partially overlies the control electrode. In this example, the field plate interconnect extends between the second electrode and the first current terminal and is configured to electrically couple the second electrode to the first current terminal. In this example, a portion of the field plate interconnect is disposed above the control electrode and is separated from the control electrode by the additional dielectric material.

Example 19: A semiconductor device as in any of Examples 17-18 in which a capacitance per area between the control electrode and the field plate interconnect is less than 10% of a capacitance per area between the first and second conductive elements and the channel region.

Example 20: A semiconductor device as in any of Examples 11-19 that further includes second dielectric material having a second dielectric thickness and overlying the first dielectric material. In this example, the second dielectric material overlies at least a first portion of the first electrode extension. In this example, a laterally-extended portion of the control electrode overhangs the first portion of the first electrode extension and is separated from the first portion of the first electrode extension by the second dielectric material.

Example 21: A semiconductor device as in any of Examples 11-20 in which a laterally-extended portion of the control electrode extends asymmetrically beyond the first electrode extension toward the first current terminal and is separated from the channel region by the second dielectric material and the first dielectric layer.

Example 22: A semiconductor device as in any of Examples 11-21 in which a capacitance per area between a laterally-extended portion of the control electrode and the transistor channel is less than 20% of a capacitance per area between the first and second conductive elements and the channel region.

Example 23: A semiconductor device as in any of Examples 11-22 in which the first dielectric layer and the second dielectric material are configured such the channel region is fully depleted of free charge carriers beneath the field plate electrode when an electrostatic potential difference between the field plate electrode and the channel region is in a range between −2 Volts and −30 Volts.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The preceding detailed description and examples are merely illustrative in nature and are not intended to limit the embodiments of the subject matter or the application and uses of such embodiments. Any use herein of the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

As used herein, a "node" or "terminal" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in one or more embodiments of the depicted subject matter.

What is claimed is:

1. A method of fabricating a semiconductor device comprising:
   depositing first electrically conductive material over a first dielectric layer, the first dielectric layer overlying a channel region of a semiconductive substrate suitable for use as a semiconductive transistor channel;
   during a first patterning step, simultaneously forming first, second, and third conductive elements above the channel region that are electrically isolated from each other by selectively removing a portion of the first electrically conductive material, wherein the second conductive element is disposed between the first and third conductive elements;
   depositing second dielectric material over the first, second, and, third conductive elements, and over the first dielectric layer;
   during a second patterning step, forming a first aperture between the first and second conductive elements that passes through the first dielectric layer and the second dielectric material by:
      selectively removing a first portion of the second dielectric material to leave remaining second dielectric material; and
      removing a portion of the first dielectric layer above the channel region in an area between the first and second conductive elements;
   forming an electrically conductive control electrode that electrically contacts the first and second conductive elements and extends within the first aperture;
   during a third patterning step, forming a second aperture that passes through the second dielectric material by selectively removing the remaining second dielectric material over the third conductive element; and
   forming an electrically conductive field plate interconnect that extends within the second aperture and electrically contacts the third conductive element within the second aperture.

2. The method of claim 1, further comprising:
   depositing additional dielectric material that overlies the control electrode and the remaining second dielectric material;
   wherein forming the second aperture also includes selectively removing the additional dielectric material above the third conductive element to leave remaining additional dielectric material above the channel region and to leave the first and second conductive elements above the channel region.

3. The method of claim 2 further comprising:
   causing a portion of the field plate interconnect to overlie the remaining additional dielectric material and the control electrode; and
   causing the field plate interconnect to electrically contact a first current terminal of the transistor at a first end of the channel region opposite the first, second, and third conductive elements that is nearest to the first conductive element.

4. The method of claim 2, wherein an effective dielectric constant of the additional dielectric material is lower than an effective dielectric constant of the first dielectric layer.

5. The method of claim 2,
   wherein forming the first aperture includes anisotropically etching the second dielectric material using a first anisotropic etching procedure; and
   wherein the first anisotropic etching process is characterized by a first etch rate with the respect to the to second dielectric material and a second etch rate with respect to the first electrically conductive material that is lower than the first etch rate.

6. The method of claim 5, wherein the first electrically conductive material is titanium, a titanium-tungsten alloy, or an aluminum-titanium alloy.

7. The method of claim 2,
   wherein forming the second aperture includes anisotropically etching the remaining second dielectric material and the remaining additional dielectric material using a second anisotropic etching procedure; and wherein the second anisotropic etching process is characterized by a third etch rate with respect to the additional dielectric material and a fourth etch rate with respect to the first electrically conductive material that is lower than the third etch rate.

8. The method of claim 2, wherein selectively removing a portion of the first electrically conductive material includes forming source and drain electrodes from the first electrically conductive material at opposite ends of the channel region simultaneously with forming the first, second, and third conductive elements.

9. The method of claim 2,
wherein the first dielectric layer has a thickness of less than 300 nanometers; and
wherein a cumulative thickness of the second dielectric material and the additional dielectric material is in a range from 50 to 5000 nanometers.

10. The method of claim 1, further comprising:
forming a dielectric spacer above the first dielectric layer at a location between a first end and a second end of the channel region; and
causing a portion of the third conductive element to overlie the dielectric spacer.

\* \* \* \* \*